US008397127B2

(12) United States Patent
Otsuka

(10) Patent No.: US 8,397,127 B2
(45) Date of Patent: Mar. 12, 2013

(54) SEMICONDUCTOR RECORDING DEVICE AND SEMICONDUCTOR RECORDING DEVICE CONTROL METHOD

(75) Inventor: Takeshi Otsuka, Hyogo (JP)

(73) Assignee: Panasonic Corporation, Osaka (JP)

( * ) Notice: Subject to any disclaimer, the term of this patent is extended or adjusted under 35 U.S.C. 154(b) by 351 days.

(21) Appl. No.: 12/952,634

(22) Filed: Nov. 23, 2010

(65) Prior Publication Data

US 2011/0214034 A1 Sep. 1, 2011

(30) Foreign Application Priority Data

Nov. 25, 2009 (JP) ................................. 2009-267113

(51) Int. Cl.
*H03M 13/00* (2006.01)
(52) U.S. Cl. .......... 714/758; 714/52; 714/763; 714/773; 714/766; 711/103; 711/105; 711/154
(58) Field of Classification Search .................. 714/758, 714/52, 766, 763, 773; 711/103, 105, 154
See application file for complete search history.

(56) References Cited

U.S. PATENT DOCUMENTS

| 6,738,944 | B1 * | 5/2004 | Kanai | 714/773 |
| 2007/0300130 | A1 * | 12/2007 | Gorobets | 714/766 |
| 2011/0209028 | A1 * | 8/2011 | Post et al. | 714/758 |
| 2011/0296273 | A1 * | 12/2011 | Rub | 714/755 |

FOREIGN PATENT DOCUMENTS

JP 2006-18373 1/2006

* cited by examiner

*Primary Examiner* — Guy Lamarre
(74) *Attorney, Agent, or Firm* — Wenderoth, Lind & Ponack, L.L.P.

(57) ABSTRACT

A semiconductor recording device includes: flash memories including a plurality of physical blocks each including a plurality of pages; an external interface unit which receives data to be recorded on the flash memories; a first ECC generation unit which generates a first ECC code by adding parity data to the data; a data writing unit which records the data based on the first ECC code into the pages in the flash memories; and a page shuffling unit which controls assignment of a symbol of the first ECC code to the pages, and the page shuffling unit controls the assignment of the symbol of the first ECC code such that the symbol of the first ECC code is assigned to pages having at least two page numbers in the physical blocks included in a group.

17 Claims, 10 Drawing Sheets

SEMICONDUCTOR RECORDING DEVICE AND SEMICONDUCTOR RECORDING DEVICE CONTROL METHOD

BACKGROUND OF THE INVENTION (1) Field of the Invention

The present invention relates to a semiconductor recording device such as a memory card and a method of controlling the semiconductor recording device, and particularly relates to a control method of suppressing variation in data retention characteristics of a o nonvolatile memory and deterioration involved in frequent rewriting onto the semiconductor recording device.

(2) Description of the Related Art

Conventionally a semiconductor recording device such as a is Secure Digital (SD) card that is a card-type recording medium including a flash memory is a microminiature and super-slim recording medium widely used in a digital camera, a mobile device, and so on for recoding the data such as images.

The flash memory incorporated in the semiconductor recording device is a memory including multiple physical blocks of a predetermined size and allows erasing the data in units of physical blocks. In response to a demand for mass-storage that has been growing in recent years, a multivalued flash memory has been commercialized which allows accumulation of the data of 2 bits or more in one cell.

As an example of the multivalued flash memory, a four-value flash memory will be described with reference to FIG. 1. FIG. 1 is a diagram showing a relationship between an accumulation state of electrons accumulated in a floating gate of the four-value flash memory and a threshold voltage (Vth).

As shown in FIG. 1, the four-value flash memory controls such an accumulation state of electrons in the floating gate in four states according to the threshold voltage (Vth) thereof. In FIG. 1, a state which indicates a smallest number of accumulated electrons (charge amount of electrons) and thus indicates a lowest potential is an erase state represented as (1, 1). Subsequently, as more and more electrons are accumulated, the threshold voltage discretely increases, and the resulting statuses are represented as: (1, 0), (0, 0), and (0, 1), respectively. Thus, since the potential increases in proportion to the number of electrons accumulated, it is possible to control the accumulation state of the electrons in four states such that the potential falls within the predetermined potential threshold. This allows recording 2-bit data in one memory cell.

However, since the four-value flash memory distinguishes between the four states according to the amount of electron charge, a difference between the threshold voltage and each of the states of the four-value flash memory is smaller than the difference between the states and the threshold voltage of the two-value flash memory.

In addition, rewriting of data, when repeated, causes slight is damage to a gate oxide film as a result of injection and extraction of electrons. Such damages, when accumulated, form a number of electron traps, thus resulting in decrease in actual number of electrons to be accumulated in the floating gate. Furthermore, in proportion to miniaturization of semiconductor processing, the number of electrons accumulated in the floating gates is smaller; thus, further miniaturization of the flash memory results in a greater influence of the electron trap.

As described above, further miniaturization of the multi-valued record and semiconductor process that support mass-storage of the flash memory has come to further highlight the problem of deterioration in data retention characteristics of the flash memory.

Adopted as methods to solve the above problem are (1) restricting the frequency of rewriting and (2) reinforcing error correction.

For example, Patent Reference 1 (Japanese Unexamined Patent Application Publication No. 2006-18373) discloses a technique of suppressing deterioration of data retention characteristics of the flash memory by reinforcing error correction ability by: in a flash memory including plural chips, associating blocks included in different chips within the flash memory with each other to treat the associated blocks as a common group, and assigning one block in the common group to a block for parity of user data written in another block in the common group.

However, the technique disclosed in Patent Reference 1 merely applies RAID 4 or RAID 5 that is used in HDD to the flash memory, but does not consider the configuration of the NAND-type flash memory. Thus, the method disclosed in Patent Reference 1 does not sufficiently allow suppressing deterioration of the data retention characteristics of the flash memory, thus causing a problem of occurrence of failure such as a read error.

The following will describe the problem with reference to FIG. 2. FIG. 2 is a diagram showing a memory cell configuration of the NAND-type flash memory.

As shown in FIG. 2, the NAND-type flash memory includes a matrix of flash memory cells. In a column direction, a plurality of flash memory cells directly connecting a source and a drain between a gate SGS on the source side and a gate SGB on the bit line side. In a row direction, a common word line is connected to a gate of each flash memory cell (corresponding to each page of the physical block), and a write operation or a read operation is simultaneously performed on the flash memory cells arranged along the word line.

In the write operation, a voltage Vdd is applied to a word line that is not selected, and a high voltage of approximately 20 V is applied to the word line of the flash memory that is selected, to thereby inject electrons into a floating gate of the flash memory cell into which the data is to be written.

In the read operation, the voltage Vdd is applied to the word line that is not selected, and a voltage of Vt (<Vdd) is applied to a word line of the flash memory cell that is selected. At this time, when electrons are injected into the flash memory cell in the selected word line, the flash memory turns on, and "0" is read via the bit line. On the other hand, when electrons are not injected into the flash memory cell in the selected word line, the flash memory turns off, and "1" is read via the bit line.

As the semiconductor process is more miniaturized, a smaller number of electrons are to be injected into the floating gate, which significantly increases an influence of variation in the number of electrons to be injected in each flash memory cell on the data retention characteristics. For example, an increase of some mV in the potential of the source of each flash memory cell decreases the number of electrons injected into the flash memory cell by an amount of some mV.

In the NAND-type flash memory, a flash memory that is provided in a word line located farther from the source line (reference potential line) is more affected by potential increase on the source side. For example, in FIG. 2, the flash memory cell located in word line WL7 that is farthest from the source line is most affected by potential increase on the source side.

Accordingly, in the NAND-type flash memory, a larger page number is more likely to result in further deterioration in data retention characteristics.

Thus, in improvement of data retention characteristics according to the technique disclosed in Patent Reference 1 using RAID configuration, no effective measure has been provided to deal with the structural characteristics of the NAND-type flash memory that the larger page number causes further deterioration of data retention characteristics; thus, there is a problem of being unable to sufficiently improve data retention characteristics as compared to the case of parity redundancy.

SUMMARY OF THE INVENTION

The present invention is to solve the problems described above, and it is an object of the present invention to provide a semiconductor recording device and a method of controlling the semiconductor recording device which allows increasing data retention capability through an optimum iterated code configuration in a NAND-type flash memory.

To solve this problem, a semiconductor recording device according to an aspect of the present invention is a semiconductor recording device including: at least one nonvolatile memory including a plurality of physical blocks each including a plurality of pages; an interface unit which receives data that is to be recorded on the at least one nonvolatile memory; an ECC generation unit which generates an error correcting (ECC) code by adding parity data to the data; a recording unit which records data that is based on the ECC code, in the plurality of pages included in the at least one nonvolatile memory; and a control unit which controls assignment of a symbol of the ECC code to the plurality of pages, and the plurality of physical blocks are associated with each other as a common group, and the control unit controls assignment of the symbol of the ECC code such that the symbol of the ECC code is assigned to pages having at least two page numbers across the plurality of physical blocks in the common group.

According to this aspect, the symbol of the ECC code is assigned to pages having different page numbers, so as to dispersely record the data included in the ECC code across pages having different page numbers.

Furthermore, in a semiconductor recording device according to an aspect of the present invention, it is preferable that the control unit control the assignment of the symbol of the ECC code such that the number of symbols of the ECC code is smallest, the symbols being assigned to pages having a same page number across the physical blocks in the common group.

Furthermore, in a semiconductor recording device according to an aspect of the present invention, it is preferable that the control unit control the assignment of the symbol of the ECC code such that a same symbol of the ECC code is not assigned to pages having the same page number.

Furthermore, in a semiconductor recording device according to an aspect of the present invention, it is preferable that the control unit control the assignment of the symbol of the ECC code such that the number of symbols of the ECC code is equal to or smaller than the number of parity data items included in the ECC code, the symbols being assigned to pages having the same page number across the physical blocks in the common group.

Furthermore, in a semiconductor recording device according to an aspect of the present invention, it is preferable that the control unit control the assignment of the symbol of the ECC code such that the number of symbols of the ECC code is equal to or smaller than the number of parity data items included in the ECC code, the symbols being assigned to pages having a last page number across the physical blocks in the common group.

Furthermore, in a semiconductor recording device according to an aspect of the present invention, it is preferable that the control unit divide the common group into at least two sections according to page number and control the assignment of the symbol of the ECC code such that the symbol of the ECC code is assigned to a page in one of the at least two sections.

Furthermore, in a semiconductor recording device according to an aspect of the present invention, it is preferable that the control unit divide the common group into at least two sections according to page number and control the assignment of the symbol of the ECC code such that each of user data and the parity data that are included in the ECC code is recorded in a page in a different section.

Furthermore, it is preferable that a semiconductor recording device according to an aspect of the present invention further include a plurality of word lines through which a plurality of memory cells included in the at least one nonvolatile memory are selected or deselected, that each of the plurality of word lines be connected to a corresponding one of the plurality of pages, and that the control unit control the assignment of the symbol of the ECC code such that the number of symbols of the ECC code is smallest, the symbols being assigned to the pages having a same word line number in the common group.

Furthermore, in a semiconductor recording device according to an aspect of the present invention, it is preferable that the control unit control the assignment of the symbol of the ECC code such that the same symbol of the ECC code is not assigned to the same word line number.

Furthermore, in a semiconductor recording device according to an aspect of the present invention, it is preferable that the control unit control the assignment of the symbol of the ECC code such that the same symbol of the ECC code is not assigned to pages having the same page number.

Furthermore, it is preferable that a semiconductor recording device according to an aspect of the present invention further include a plurality of word lines through which a plurality of memory cells included in the at least one nonvolatile memory are selected or deselected, that each of the plurality of word lines be connected to a corresponding one of the plurality of pages, and that the control unit control the assignment of the symbol of the ECC code such that the number of symbols of the ECC code is equal to or smaller than the number of parity data items included in the KC code, the symbols being assigned to pages having the same word line number in the common group.

Furthermore, it is preferable that a semiconductor recording device according to an aspect of the present invention further include a plurality of word lines through which a plurality of memory cells included in the at least one nonvolatile memory are selected or deselected, that each of the plurality of word lines be connected to a corresponding one of the plurality of pages, and that the control unit control the assignment of the symbol of the ECC code such that the number of symbols of the ECC code is equal to or smaller than the number of parity data items included in the ECC code, the symbols being assigned to pages having a last word line number in the common group.

Furthermore, it is preferable that a semiconductor recording device according to an aspect of the present invention further include a plurality of word lines through which a plurality of memory cells included in the at least one nonvolatile memory are selected or deselected, that each of the plurality of word lines be connected to a corresponding one of the plurality of pages, that the control unit divide the common group into at least two sections and control the assignment of the symbol of the ECC code such that the symbol of the ECC code is assigned to a page in one of the at least two sections.

Furthermore, it is preferable that a semiconductor recording device according to an aspect of the present invention further include a plurality of word lines through which a plurality of memory cells included in the at least one nonvolatile memory are selected or deselected, that each of the plurality of word lines be connected to a corresponding one of the plurality of pages, and that the control unit divide the common group into at least two sections according to a word line number and control the assignment of the symbol of the ECC code such that each of user data and the parity data that are included in the ECC code is recorded in a page in a different section.

Furthermore, it is preferable that a semiconductor recording device according to an aspect of the present invention include a second ECC generation unit which generates a second ECC code by adding second ECC parity data to the user data and the parity data that are included in the ECC code; a read unit which reads the second ECC code recorded on the at least one nonvolatile memory; a second ECC correction unit which corrects an error based on the second ECC code read by the read unit; and a first ECC correction unit which corrects an error based on the ECC code, according to a position at which the second ECC correction unit is unable to complete the error correction.

In addition, a method of controlling a semiconductor recording device according to an aspect of the present invention is a method of controlling a semiconductor recording device that includes at least one nonvolatile memory including a plurality of physical blocks each of which includes a plurality of pages and which are associated with each other as a common group, and the method includes: receiving data that is to be recorded on the at least one nonvolatile memory; generating an error correcting (ECC) code by adding parity data to the data; recording data that is based on the ECC code, in the plurality of pages included in the at least one nonvolatile memory; controlling assignment of a symbol of the ECC code to the plurality of pages; and controlling assignment of the symbol of the ECC code such that the symbol of the ECC code is assigned to pages having at least two page numbers across the plurality of physical blocks in the common group.

In addition, a recording medium according to an aspect of the present invention is a non-transitory computer-readable recording medium on which a program for controlling a semiconductor recording device that includes at least one nonvolatile memory including a plurality of physical blocks each of which includes a plurality of pages and which are associated with each other as a common group, and the program causes a computer to execute: receiving data that is to be recorded on the at least one nonvolatile memory; generating an error correcting (ECC) code by adding parity data to the data; recording data that is based on the ECC code, in the plurality of pages included in the at least one nonvolatile memory; and controlling assignment of the symbol of the ECC code such that the symbol of the ECC code is assigned to pages having at least two page numbers across the plurality of physical blocks in the common group.

In addition, a recording medium according to an aspect of the is present invention is a computer-readable recording medium on which the program described above is recorded.

According to an implementation of the present invention, even when the data retention characteristics vary according to each page number, it is possible to dispersely record the data included in the ECC code across pages having different page numbers, thus making it possible to correct a read error occurring in a page having a larger page number, using the data of a page having relatively satisfactory data retention characteristics. This allows providing a semiconductor recording device having improved data retention characteristics. Particularly, the present invention allows improving data retention characteristics of the NAND-type flash memory in which a larger page number results in further deterioration in data retention characteristics.

FURTHER INFORMATION ABOUT TECHNICAL BACKGROUND TO THIS APPLICATION

The disclosure of Japanese Patent Application No. 2009-267113 filed on Nov. 25, 2009 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Hereinafter, a semiconductor recording device, a method of controlling the semiconductor recording device, and a recording medium according to embodiments of the present invention will be described with reference to the drawings.

(First Embodiment)

First, a semiconductor recording device and a method of controlling the semiconductor recording device will be described with reference to the drawings.

(Configuration of the Semiconductor Recording Device)

Figure 1:
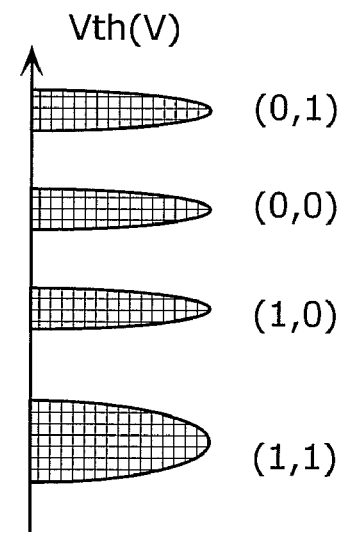
FIG. 1 is a diagram showing a relationship between an accumulation state of electrons which are accumulated in a floating gate of a four-value flash memory and a threshold voltage (Vth)
Figure 2:
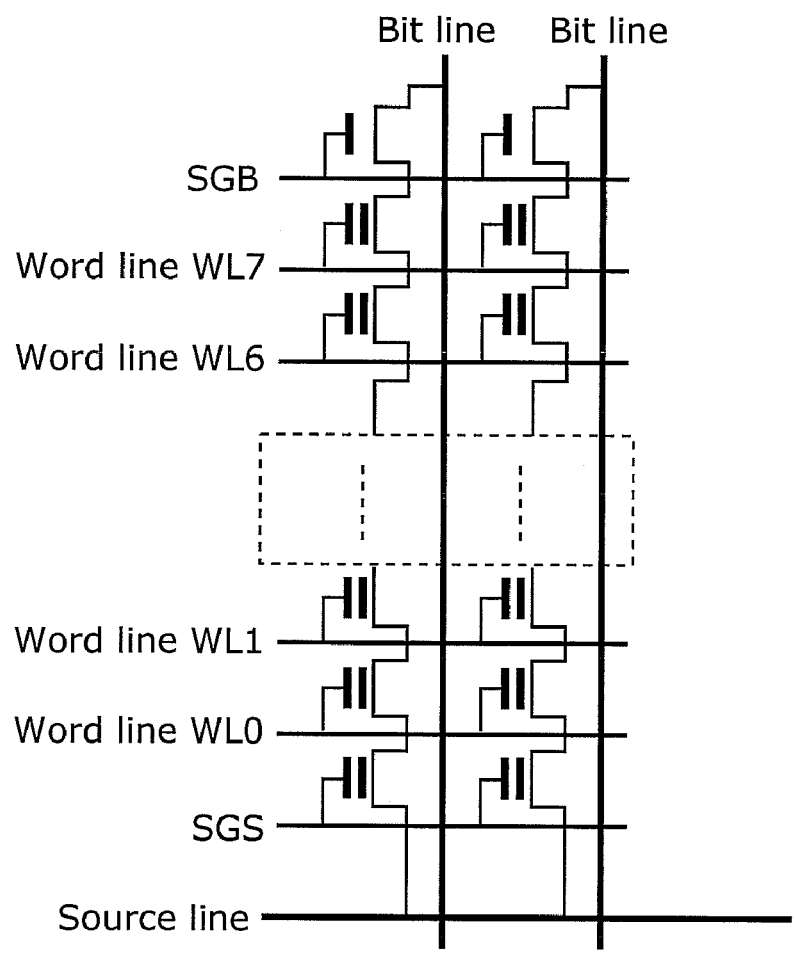
FIG. 2 is a diagram showing a memory cell configuration of a NAND-type flash memory.
Figure 3:
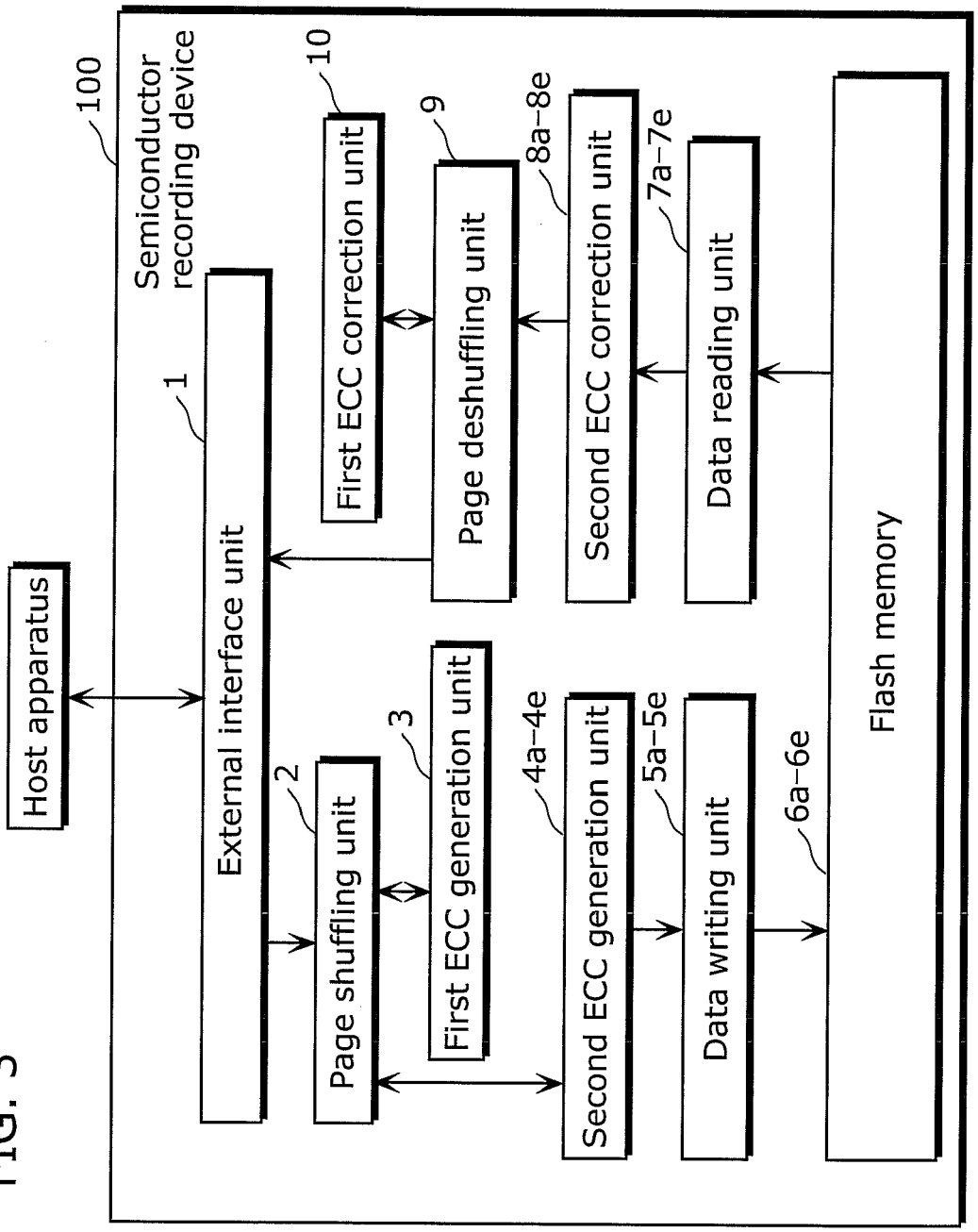
FIG. 3 is a block diagram showing a configuration of a semiconductor recording device according to a first embodiment of the present invention.

FIG. 3 is a block diagram showing a configuration of the semiconductor recording device according to the first embodiment of the present invention.

As shown in FIG. 3, a semiconductor recording device 100 according to the first embodiment includes: an external interface unit 1, a page shuffling unit 2, a first ECC generation unit 3, second ECC generation units 4a to 4e, data writing units 5a to 5e, flash memories 6a to 6e, data reading units 7a to 7e, second ECC correction units 8a to 8e, a page deshuffling unit 9, and a first ECC correction unit 10.

In the semiconductor recording device 100 according to the present embodiment, a series of five systems a, b, c, d, and e are provided in each of: the second ECC generation units 4a to 4e, the data writing units 5a to 5e, the flash memories 6a to 6e, the data reading units 7a to 7e, and the second ECC correction units 8a to 8e.

In FIG. 3, the external interface unit 1 is an interface which receives and transmits a predetermined command or data from an external device such as a host device or the like, and which performs data transfer.

Specifically, the external interface unit 1 receives, from the host device, a write command and write data that is to be recorded on the flash memories 6a to 6e, and transfers the write command and the write data to the page shuffling unit 2 and so on. In addition, the external interface unit 1 receives a read command from the host device and also receives, as read data, the data recorded on the flash memories 6a to 6e, from the page deshuffling unit 9, and transmits the read command and the read data to the host device.

The page shuffling unit 2 includes memory (memory unit) and a control unit that controls the memory (control unit), and functions as a control unit which controls assignment of the symbol of a first Error Correcting (ECC) code to a corresponding page among a plurality of pages included in each physical block in the flash memories.

According to the present embodiment, the page shuffling unit 2 controls the assignment of the symbol of the first ECC code to the pages such that the symbol of the first ECC code is assigned to pages having at least two page numbers across different physical blocks. In other words, the page shuffling unit 2 performs control for dispersing the symbol of the first ECC code across different pages by shuffling the pages in each physical block such that the symbol of the first ECC code is assigned to pages having different page numbers between the respective physical blocks in a plurality of flash memories. For example, assuming that the data of 4 KB is recorded in the pages of the flash memories 6a to 6e, the page shuffling unit 2 includes three memory areas of 160 KB (=4 KB*8*5) and a control circuit thereof. Each memory area includes a user data storage unit of 128 KB (=4 KB*8*4) and a first ECC parity storage unit of 32 KB (=4 KB*8).

The page shuffling unit 2 thus configured, when receiving the write command and the write data from the host device via the external interface unit 1, sequentially writes the received write data into the memory of the page shuffling unit 2. Then, for the data written into the memory, four pages that are to be assigned to different page numbers across physical blocks in the four flash memories 6a to 6d are extracted, and the data corresponding to each of the extracted pages is read by 1 byte. The read data corresponding to each page is input, in units of 4 bytes, into the first ECC generation unit 3, and as described later, the first ECC generation unit 3 sequentially generates the first ECC code, and the user data and the first ECC parity (first ECC parity data) that are included in the first ECC code are written into the memory of the page shuffling unit 2.

In addition, the page shuffling unit 2 reads the user data and the first ECC parity that are written into the memory, as described later, in order of the page to be written into the five flash memories 6a to 6e, and outputs, to the second ECC generation units 4a to 4e, the user data and the first KC parity that are read.

The first ECC generation unit 3 is an ECC generation unit which generates the ECC code by adding the parity data to the data. In the present embodiment, the first ECC generation unit 3 sequentially generates the first ECC parity (the first ECC parity data) by performing a logical EXOR operation on the data (user data) that is input by the page shuffling unit 2 in units of 4 bytes, and generates the first ECC code by adding the first ECC parity to the user data of each 4 bytes. In addition, the first ECC generation unit 3 outputs, to the page shuffling unit 2, the user data and the first ECC parity that are included in the first ECC code.

Each of the second ECC generation units 4a to 4e generates a second ECC code by adding, on a per-page basis, a second ECC parity (the second ECC parity data) to the data of five pages which includes the user data and the first ECC parity that have been read by the page shuffling unit 2.

Each of the data writing units 5a to 5e is a recording unit which records predetermined data on a corresponding one of the flash memories 6a to 6e. The data writing units 5a to 5e write, into each predetermined page in the flash memories 6a to 6e, the data to which the second ECC parity is added and which is included in the second ECC code generated by the second ECC generation units 4a to 4e.

Each of the flash memories 6a to 6e is a nonvolatile memory for recording predetermined data, and includes a physical block including a plurality of pages. In the present embodiment, each of the flash memories 6a to 6e is a NAND-type flash memory. Note that of the flash memories 6a to 6e, four flash memories 6a to 6d are memories for recording the user data, and the remaining flash memory 6e is a memory for recording the first ECC parity (a memory dedicated to the first ECC parity).

In the present embodiment, physical blocks in the flash memories 6a to 6e are associated with each other as a common group corresponding to the first ECC code. In such flash memories 6a to 6e, the symbol of the first ECC code is assigned to pages having at least two page numbers across different physical blocks, and the user data and the first parity included in the first ECC code are recorded in a predetermined page.

Note that a page is a minimum unit of recording (write access unit) that allows recording as seen from the external device such as the host device, and the block is a minimum unit of erasing. In the present embodiment, each page is 4 Kbytes, and each block is 32 Kbytes (4 Kbytes*8 pages). The data reading units 7a to 7e read the predetermined data from each page in each of the flash memories 6a to 6e that corresponds to a logical block designated by the read command received by the external interface unit 1 from the host device. For example, the data reading units 7a to 7e read the user data and the second ECC parity that are included in the second ECC code and recorded on the flash memories 6a to 6e.

The second ECC correction units 8a to 8e correct an error if any, based on the second ECC parity included in the second ECC code generated by the second ECC generation units 4a to 4e, and output, to the page deshuffling unit 9, the corrected data and an error flag indicating whether or not correction is possible.

The page deshuffling unit 9 transfers, directly to the external interface unit 1, the data that is correctable by the second ECC correction units 8a to 8e; on the other hand, when the data is not correctable by the second ECC correction units 8a to 8e, the data included in the first ECC code is read from the flash memories 6a to 6e.

The first ECC correction unit 10 corrects an error, using the data that is not correctable by the second ECC correction units 8a to 8e and the data including in the first ECC correction code that is read by the page deshuffling unit 9, and transfers the corrected data to the external interface unit 1.

(Control Method for Semiconductor Recording Device)

Next, a method of controlling the semiconductor recording device 100 according to the first embodiment will be described with reference to the drawings.

(Write Operation)

First, a write operation performed in writing the data into the semiconductor recording device 100 according to the present embodiment will be described with reference to FIG. 3, using FIGS. 4 and 5.

First, the configuration of the physical block in the flash memory in the semiconductor recording device 100 according to the present embodiment will be described using FIG. 4. FIG. 4 is a diagram showing a relationship between each page in the physical blocks and the first ECC code (user data and parity) in the semiconductor recording device 100 according to the first embodiment. Note that FIG. 4 shows a relationship between pages in the physical blocks provided in parallel and the first ECC code in the case of recording the data into the five flash memories 6a to 6e.

Figure 4:
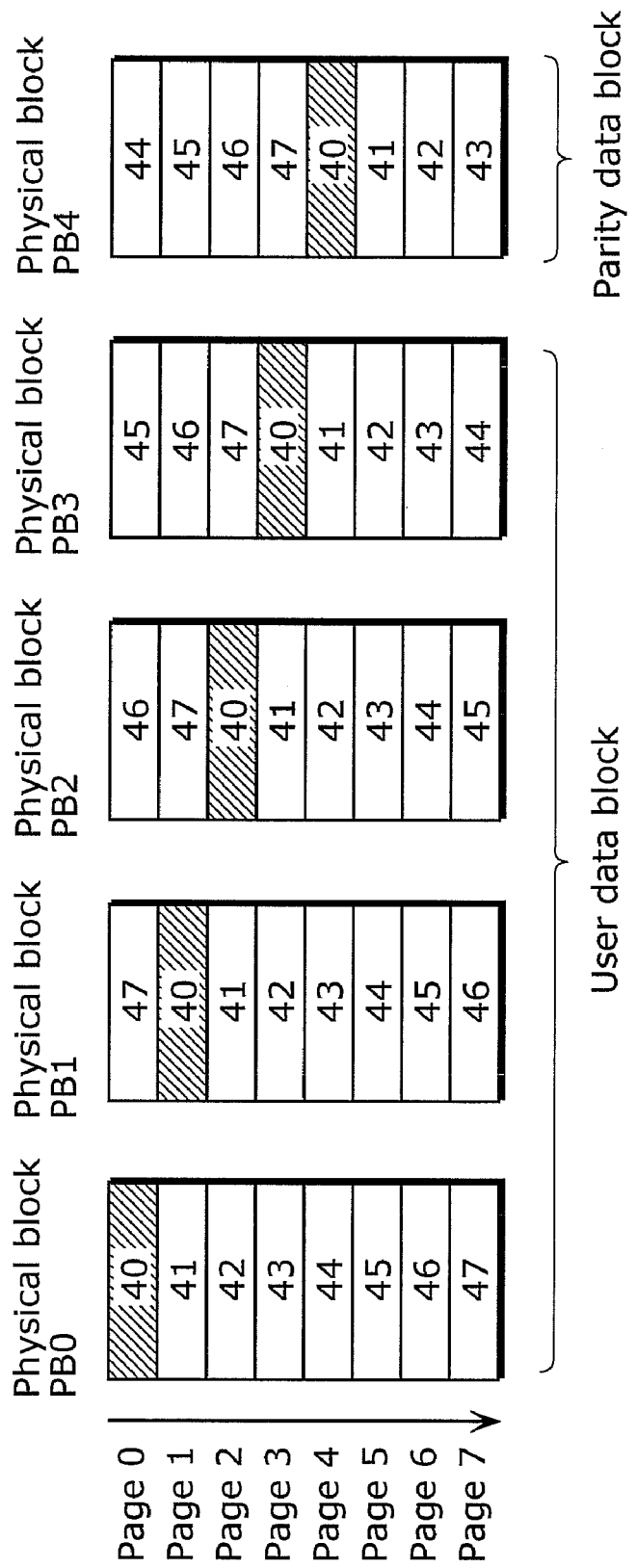
FIG. 4 is a diagram showing a relationship between each page in a physical block and a first ECC code in the semiconductor recording device according to the first embodiment of the present invention.

In FIG. 4, a physical block PB0 is a physical block in a flash memory 6a, a physical block PB1 is a physical block in a flash memory 6b, and likewise hereinafter, the physical blocks PB2, PB3, and PB4 are physical blocks in the flash memories 6c, 6d, and 6e, respectively. The four physical blocks PB0 to PB3 are user data blocks corresponding to the user data, and the physical block PB4 is a parity block dedicated to the parity data.

In addition, each of the physical blocks PB0 to PB4 includes eight pages which serially indicate page 0 to page 7 from the top. Note that in the present embodiment, since the flash memories 6a to 6e are NAND-type flash memories, the data retention characteristics are likely to deteriorate more significantly as the page number increases. More specifically, in the present embodiment, page 7 has the highest possibility of deterioration in data retention characteristics.

Codes 40 to 47 added to the pages in each physical block PB0 to PB4 are identification codes (symbols) for identifying the first ECC code, and one first ECC code includes the data of five pages to which a same code number is added. That is, in the present embodiment, the number of symbols in the first ECC code is five (5 bytes).

For example, the five symbols of the first ECC code to which the code 40 is added are assigned to five pages: page 0 in the physical block PB0, page 1 in the physical block PB1, page 2 in the physical block PB2, page 3 in the physical block PB3, and page 4 in the physical block PB4. Then, the user data included in the first ECC code to which the code 40 is added is written into: page 0 in the physical block PB0, page 1 in the physical block PB1, page 2 in the physical block PB2, and page 3 in the physical block PB3. In addition, the first ECC parity included in the first ECC code to which the code 40 is added is written into page 4 of the physical block PB4.

Likewise, the five symbols of the first ECC code to which the code 41 is added are assigned to five pages: page 1 of the physical block P130, page 2 of the physical block P131, page 3 of the physical block PB2, page 4 of the physical block PB3, and page 5 of the physical block P134. Then, the user data included in the first ECC code to which the code 41 is assigned is written into page 1 in the physical block PB0, page 2 in the physical block PB1, page 3 in the physical block PB2, and page 4 in the physical block PB3. In addition, the first ECC parity included in the first ECC code to which the code 41 is added is written into page 5 of the physical block P134.

Thus, according to the present embodiment, the symbol of each first ECC code is assigned such that the page number is incremented by one as the physical block number increases by one. Note that the same is applicable to the codes 42 to 47, and the description thereof will therefore be omitted.

In addition, in FIG. 4, logical addresses in the user data block (physical blocks PB0 to PB3) are arranged, at the same page number, in an order starting from the physical block PB0 to the physical block PB3, and also in an ascending order of the page number starting from a page having a smallest number to a page having a largest number. Specifically, the order is: PB0-40, PB1-47, PB2-46, PB3-45, PB0-41, PB1-40, ..., PB0-47, PB1-46, PB2-45, and PB3-44. Here, PB0-40 represents the physical block PB0 to which the code 40 is added, and PB1 represents the physical block PB1 to which the code 47 is added. Hereinafter, the same is applied.

Next, the write operation of the semiconductor recording device 100 according to the present embodiment will be described in detail.

First, the external interface unit 1 as shown in FIG. 3 receives, from the host device, the write data including the user data and a write command for recording the write data into the flash memories 6a to 6e. The write data, when received, is transferred to the page shuffling unit 2 in order of reception, and is written into the memory of the page shuffling unit 2.

The page shuffling unit 2 extracts, for the data written into the memory, four pages having different page numbers from four physical blocks PB0 to PB3 shown in FIG. 4, and the data corresponding to each of the extracted pages is read by 1 byte.

The data corresponding to each of the read pages is input into the first ECC generation unit 3 in units of 4 bytes, and the first ECC generation unit 3 sequentially generates the first ECC code. More specifically, the user data is sequentially extracted by 1 byte from the top of each page in the physical blocks PB0 to PB3 that are user data blocks, and as a result of performing the logical EXOR operation on the 4-byte user data that is extracted, the first ECC parity is generated and added to the user data. Thus, the first ECC code is generated.

Note that in the case of writing the user data of 4 Kbytes into each page, 4 K first ECC codes to which the identification code 40 is added are generated. In addition, the user data and the first ECC parity that are included in the first ECC code are written into the memory of the page shuffling unit 2.

As described above, when the ECC code of 5 bytes including the ECC parity has an error of 1 byte and when the error position of the ECC code is determined, the ECC configuration according to the present embodiment allows restoring the 1 byte determined as an error by performing the logical EXOR operation using the 4 bytes that are not errors.

An operation of the page shuffling unit 2 will be described in detail using FIG. 5. Note that the page shuffling unit 2 includes, as described above, three memory areas of 160 KB (=4 KB*8*5) and a control circuit that controls the memory areas, and each memory area includes a data storage unit (user data storage unit) of 128 KB (=4 KB*8*4) and the first ECC parity storage unit (first ECC parity data storage unit) of 32 KB.

Figure 5:
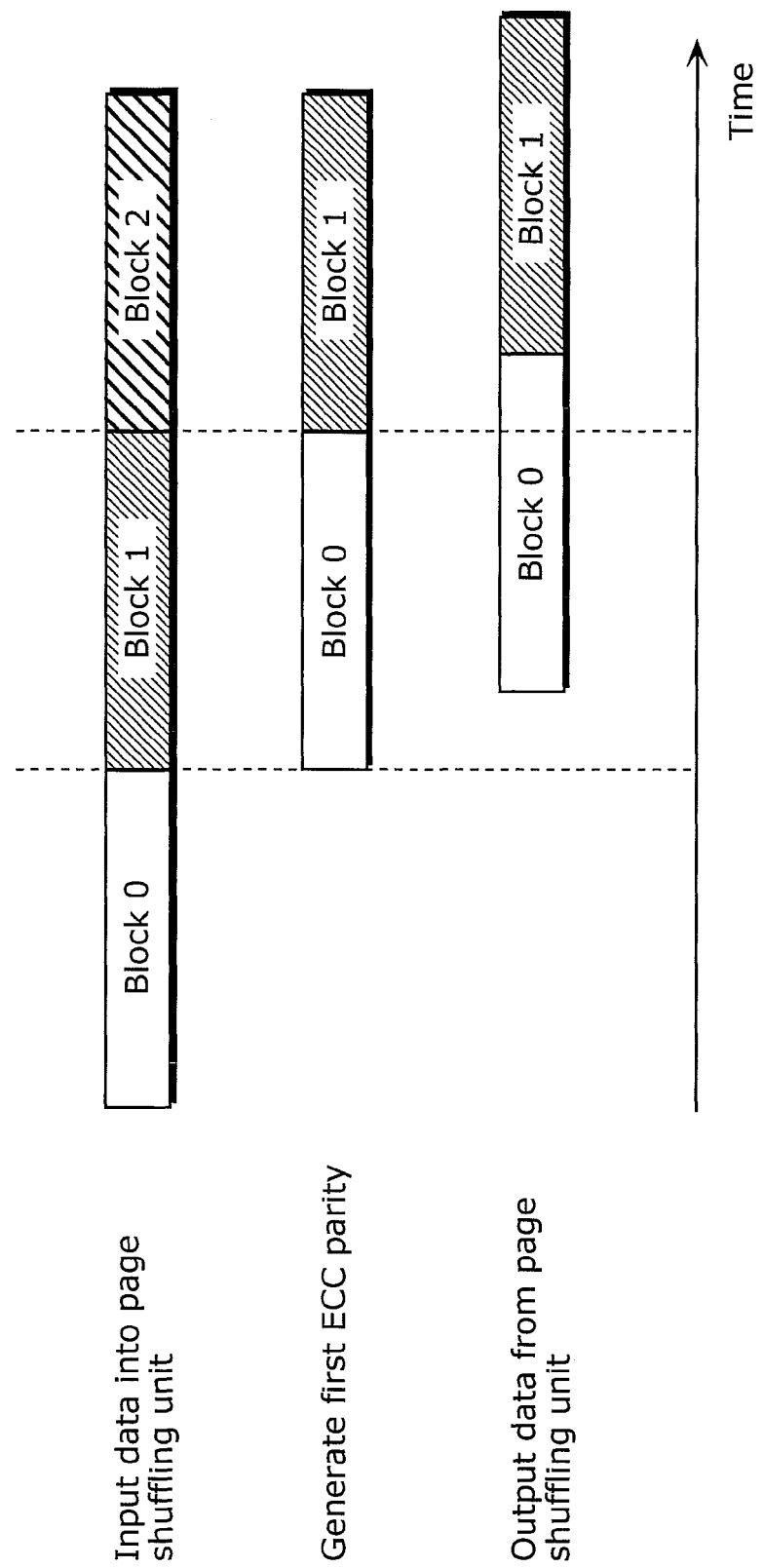
FIG. 5 is a timing chart indicating input and output performed by a page shuffling unit during a write operation of the semiconductor recording device according to the first embodiment of the present invention.

FIG. 5 is a timing chart indicating input and output performed by the page shuffling unit 2 in the write operation of the semiconductor recording device 100 according to the first embodiment of the present invention. In FIG. 5, a top row indicates timing of data input into the page shuffling unit 2, and each block in the top row (blocks 0 to 2 in the figure) represents the data storage unit of 128 KB. As shown in FIG. 5, the data input into the page shuffling unit 2 is performed on a per-block basis of 128 KB. In other words, after completion of the data input into all the pages in all the user data blocks, the data input into the next block is started. In the present embodiment, as shown in FIG. 4, after completion of the data input into each of the eight pages (128 KB) in the four physical blocks from PB0 to PB3, the data input into each of the next eight pages in the four physical blocks PB0 to PB3 is started. Specifically, the data input is performed in order of logical address, that is, in order of PB0-40, PB1-47, PB2-46, PB3-45, PB0-41, PB1-40, . . . , PB0-47, PB1-46, PB2-45, and PB3-44.

In addition, in FIG. 5, the middle row indicates timing for generating the first ECC parity in the first ECC parity generation unit 3, and each block in the middle row (blocks 0 to 1 in the figure) represents the first ECC parity storage unit of 32 KB corresponding to the data storage unit of 128 KB described above. As shown in FIG. 5, the first ECC parity is generated on a per-block basis of 32 KB. In other words, the first ECC parity is generated for the next parity block after generating the first ECC parity for all the pages in the current parity block.

In the present embodiment, after generating the first ECC parity for each of the eight pages (32 KB) included in the physical block PB4 as shown in FIG. 4, the first ECC parity is generated for each of the next eight pages in the physical block PB4. More specifically, the first ECC parity of 32 KB is generated in units of 4 KB in order, starting from code 44, 45, 46, 47, 41, 42, and 43, in the physical block PB4 shown in FIG. 4.

Note that as shown in the figure, after completion of input of the data of 128 KB that is equivalent to one block, into the data storage unit, the first ECC parity for the data is generated.

In addition, in FIG. 5, the bottom row indicates timing of data output from the page shuffling unit 2, and each block in the bottom row (blocks 0 and 1 in the figure) is 160 KB which includes both the user data and the first ECC parity, the data storage unit outputs the data in order of input as shown in the figure, and the first ECC parity is output in order of generation. As shown in the figure, each time the first ECC parity is generated, the data including both the user data and the first ECC parity is output.

Thus, the page shuffling unit 2, along with the first ECC parity generation unit 3, is controlled by pipeline on a per-block basis. The output data thus output from the page shuffling unit 2 is input into the second ECC generation units 4a to 4e.

The second ECC generation units 4a to 4e add, for each page in the flash memory, the second ECC parity to the data of 4 Kbytes input from the page shuffling unit 2. In other words, the second ECC generation units 4a to 4e generate the second ECC code by adding, on a per-page basis, the second ECC parity to the data of five pages which includes the user data and the first ECC parity and is read by the page shuffling unit 2.

Note that considering that the unit of access from the host device is a sector (=512 bytes), it is possible to correct errors up to 8 bytes by providing eight systems of Reed-Solomon code in which a 16-byte parity is added to the 512 bytes. In addition, since five systems of the second ECC generation units 4a to 4e are installed, it goes without saying that the data corresponding to the write page order of each flash memory may be output. In addition, as described above, by operating the memory in three areas, it is possible to prevent deterioration in transfer rate from occurring in successive writes.

The data writing units 5a to 5e record, on the flash memories 6a to 6e, the data to which the second ECC parity is added and which is included in the second ECC code generated by the second ECC generation units 4a to 4e. In the present embodiment, the data writing units 5a to 5e are provided in parallel, each of which writes the data into a corresponding one of the pages in one of the physical blocks in each of the five flash memories 6a to 6e.

Thus, the write operation in the semiconductor recording device 100 is completed. Note that in the present embodiment, a configuration assumed as including one group made up of five physical blocks, but the configuration may include more physical blocks, and such physical blocks may be associated with each other as two or more groups (for example, the configuration may include 10 physical blocks based on two groups each including five blocks).

(Read Operation)

Next, a read operation for reading the data from the semiconductor recording device 100 according to the first embodiment will be described with reference to FIGS. 3 and 4.

First, the external interface unit 1 shown in FIG. 3 receives a read command from the host device. The read command designates the logical block that holds the data to be read.

The data reading units 7a to 7e reads predetermined data from each page in each of the flash memories 6a to 6e that corresponds to the logical block designated by the read command. In the present embodiment, the user data and the second ECC parity that are included in the second ECC code recorded on the flash memories 6a to 6e are read.

The second ECC correction units 8a to 8e correct an error if any, based on the second ECC code that is read, and output, to the page deshuffling unit 9, the corrected data and an error flag indicating whether or not correction is possible.

For example, the second ECC correction units 8a to 8e perform error detection and error correction, in accordance with a received code polynomial U(X) of $528^{th}$ degree, which is represented by 528 bytes (=512+16) including the user data and the ECC parity that are read. In the Reed-Solomon code to which a 16-byte parity is added, an error of 8 bytes or less is correctable, but an error of above 8 bytes is not correctable. Thus, the second ECC correction units 8a to 8e output, to the page deshuffling unit 9, the corrected data and the error flag indicating whether or not correction is possible. Note that when the correction is not possible, the error flag on the current sector indicates "1".

The page deshuffling unit 9 switches the processing according to the error flag that is output from the second ECC correction units 8a to 8b and indicates whether or not correction is possible.

When the error flag on a sector from which the data is output indicates "0", the correctable data is directly transferred to the external interface unit 1, and the data in the current sector is output via the external interface unit 1.

On the other hand, when the error flag on the sector from which the data is output indicates 1", the sector having the error flag "1" is not read, but the current sector and the other four sectors included in the first ECC code and having the error flag "0" are read from the flash memories 6a to 6e.

For example, in FIG. 4, when the error flag on the first 512 bytes in the page PB0-40 indicates "1", the processing is performed in the steps below.

(Step 1)

page deshuffling unit 9 calculates the position of the page at which the sector having an error flag "1" and the other four sectors included in the first ECC code are recorded, that is, the page number of the physical block.

In the case of FIG. 4, the page number of each physical block, which is included in the first ECC code, can be calculated as below according to the page number PB0X of the physical block PB0:

Page number of PB1=(PB0X+1) % 8
Page number of PB2=(PB0X+2) % 8
Page number of PB3=(PB0X+3) % 8
Page number of PB4=(PB0X+4) % 8

Since the page PB0-40 is the first page in the physical block PB0 (page 0), the page number of each physical block is calculated by substituting 0 into PB0X in the above formula. Here, in the above formula, "%" represents an operator for calculating a residue (remainder of division). For example, when PB0X is 0, the page number of the above PB1 is (0+1) % 8=1, that is, page 1. Likewise, the page number of PB2 is page 2, the page number of PB3 is page 3, and the page number of PB4 is page 4.

Note that the present embodiment assumes a setting in which the page number is incremented by one as the block number increases by one, but the present embodiment is not limited to this case.

(Step 2)

The data reading units 7a to 7e read the data from the page calculated in step 1, and the second ECC correction units 8a to 8e perform error correction.

(Step 3)

When at least one error flag "1" is present, the second ECC correction units 8a to 8e return, to the host device, an interruption indicating that correction is not possible. In the case of no error, the process proceeds to Step 4.

(Step 4)

The data in the page 4 having an error flag "0" is input into the first ECC correction unit 10, and the data in the page having the error detected is corrected.

(Step 5)

The data having the error corrected is output via the external interface unit 1.

With this, the read operation performed in the semiconductor recording device 100 according to the present embodiment is completed.

As described above, in the semiconductor recording device 100 and the method of controlling the semiconductor recording device 100 according to the first embodiment, the following processing is performed in the flash memory: (i) associating a plurality of physical blocks in at least one flash memory with each other to treat the associated physical blocks as a common group, (ii) generating an ECC code by generating parity data from the user data, (iii) assigning a symbol of the ECC code to pages having different page numbers in the common group such that the number of symbols of each ECC code to be written into pages having the same page number in the common group is smallest, and (iv) writing the user data and the ECC parity that are included in each ECC code into pages having different page numbers in the common group.

With this, even when data retention characteristics vary according to each page number, it is possible to dispersely write the data including the first ECC data into the pages having different page numbers, thus allowing improvement of data retention characteristics of the entire semiconductor recording device. For example, as seen in the NAND-type flash memory, even in the configuration in which data retention characteristics further deteriorate as the page number increases, it is possible to write the user data and ECC parity data included in the first ECC code in a form of dispersing a page having a larger page number which indicates poorer data retention characteristics, thus allowing correcting a read error occurring in the page having a larger page number, using the data in a page having a smaller page number which indicates relatively sufficient data retention characteristics. This allows providing a semiconductor recording device having improved data retention characteristics.

In addition, in the present embodiment, the data is dispersed such that each symbol of the first ECC code having the same symbol is not assigned to pages having the same page number. This further equalizes the data retention characteristics of the semiconductor recording device, thus achieving further improvement in data retention characteristics.

Note that in the present embodiment, in a five-chipped flash memory, the first ECC code has been generated based on the data that is to be written into pages having different page numbers in the physical blocks in each of the chips, but the present embodiment is not limited to this case. For example, when one-chipped flash memory includes a plurality of physical blocks, it is possible to extract a plurality of physical blocks from the one-chipped flash memory, and to generate the first ECC code based on the data to be written into pages having different page numbers in each physical block.

In addition, in the present embodiment, a fixed flash memory chip is assigned for the parity data, but the physical block and the page for the parity data may be variable as long as the position can be determined by the control circuit.

In addition, in the present embodiment, the first ECC code is generated by writing the data into the memory of the page shuffling unit 2 and subsequently reading the data and adding the first ECC parity to the data. However, the memory of the page shuffling unit 2 may be controlled such that, after generating the first ECC code for the input data, the data is into the memory, and then the bytes constituting the first ECC code are written into different pages included in the flash memory.

In addition, in the present embodiment, the bytes constituting the first ECC code are written by providing an offset to different physical blocks on a per-page basis, but the present embodiment is not limited to this case.

(First Variation of the First Embodiment)

Figure 6:
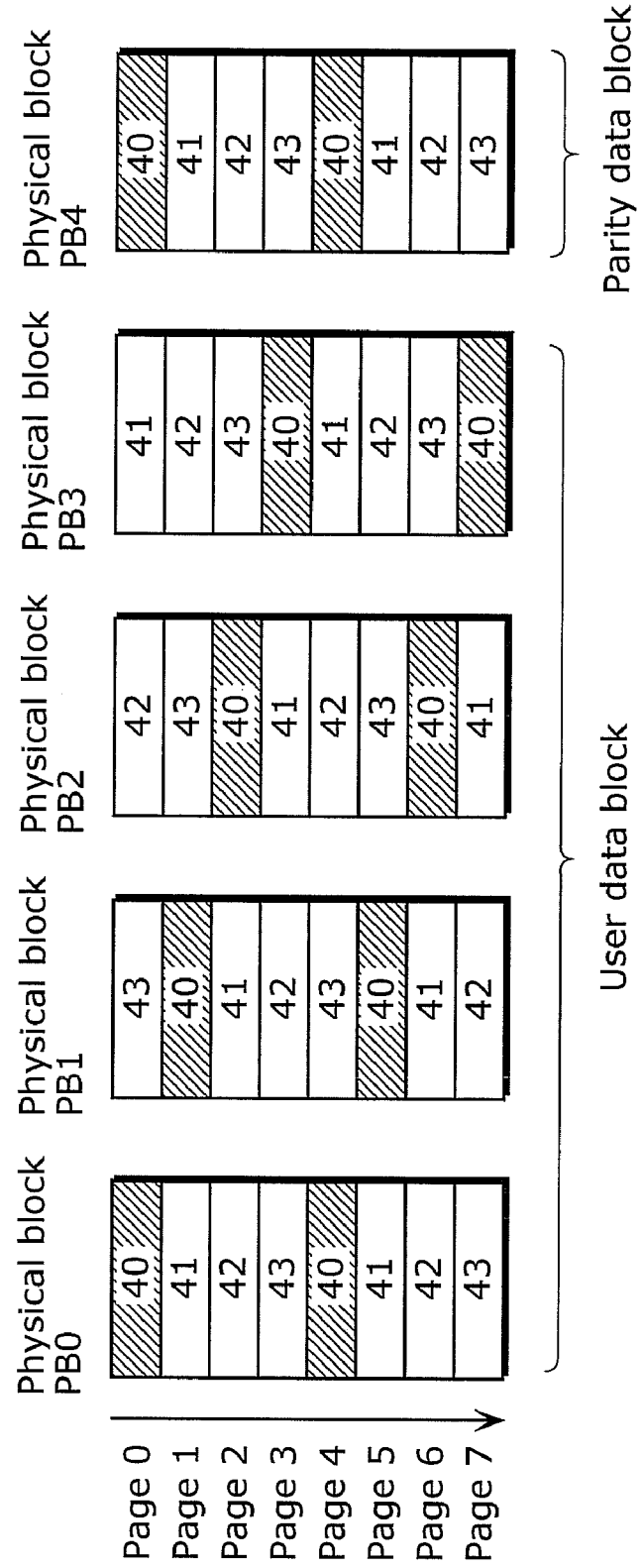
FIG. 6 is a diagram showing a relationship between each page in a physical block and a first ECC code in the semiconductor recording device according to a first variation of the first embodiment of the present invention.

Next, the semiconductor recording device according to a first variation of the first embodiment will be described with reference to FIG. 6. FIG. 6 shows a relationship between each page in the physical blocks and the first ECC code (the user data and parity), in the semiconductor recording device according to the first variation of the first embodiment. Note that FIG. 6 shows a relationship between the page and each ECC code when writing, into five physical blocks, a 10-byte ECC code generated by adding a parity of 2 bytes to the user data of 8 bytes.

Although, in the semiconductor recording device according to the first embodiment, the parity included in the first ECC code to which the same code is added is assumed as 1 byte, the parity of 2 bytes or more may be added to the user data. For example, this is applicable to the case of the first ECC code which has a large number of bytes and to which a plurality of ECC parities are added.

In the semiconductor recording device according to the present variation, the case of generating the ECC code of 10 bytes by adding the ECC parity of 2 bytes to the user data of 8 bytes will be described.

In FIG. 6, each of the physical blocks PB0, PB1, PB2, PB3, and PB4 is a physical block for a corresponding one of the five flash memories 5*a* to 5*e*. Note that the four physical blocks PB0 to PB3 are user data blocks corresponding to the user data, and the physical block PB4 is a parity block dedicated to the parity data.

In addition, each of the physical blocks PB0 to PB4 includes eight pages which serially indicate page 0 to page 7 from the top. Note that in the present embodiment, each of the flash memories 6*a* to 6*e* is a NAND-type flash memory.

The codes 40 to 43 assigned to pages in the respective physical blocks are identification codes for identifying the first ECC code, and one first ECC code includes the data (user data and ECC parity data) to which the same code number is added.

As shown in FIG. 6, the present variation assumes a double ECC parity system which writes two ECC parities for one parity block (physical block PB4).

Then, when focusing on the page number of the page into which the data included in each ECC code is written, of the ten symbols of the ECC code to which the code 40 is added, 2 symbols are assigned to each of the pages 0 and 4, and one symbol is assigned to the other 6 pages.

In addition, of the ten symbols of the ECC code to which the code 41 is added, 2 symbols are assigned to each of the pages 1 and 5, and one symbol is assigned to the other 6 pages. Likewise, of the ten symbols of the ECC code to which the code 42 is added, 2 symbols are assigned to each of the pages 2 and 6, and one symbol is assigned to the other 6 pages. In addition, of the ten symbols of the ECC code to which the code 43 is assigned, 2 symbols are assigned to each of the pages 3 and 7, and one symbol is assigned to the other 6 pages.

Thus, by setting the number of symbols of the ECC code that are to be assigned to pages having the same page number, to a number equal to or smaller than the number of ECC parities, it is possible to suppress the deterioration in data retention characteristics within a correction range even when deterioration in data retention characteristics is caused in a page having a specific page number such as the last page in the physical block, thus allowing providing a semiconductor recording device having improved data retention characteristics.

In addition, in the present embodiment, it is preferable to set the number of symbols of the ECC that are to be assigned to pages having the last page number, to a number equal to or smaller than the number of ECC parities. Of the NAND-type flash memory, the data retention characteristics further deteriorate as the page number increases, and the data retention characteristics of the last page number is most likely to deteriorate. Accordingly, by setting the number of ECC-code symbols assigned to the page having the last page number to a number equal to or smaller than the number of ECC parities, it is possible to further improve the data retention characteristics of the semiconductor recording device.

Note that in the present variation, the ECC-code symbols are evenly assigned across all the pages, but the present variation is not limited to this. For example, the number of symbols of the ECC code that are to be assigned to a page having poor retention characteristics may be equal to or smaller than the number of ECC parities, and a larger number of symbols may be assigned to a page having satisfactory retention characteristics.

(Second Variation of the First Embodiment)

Figure 7:
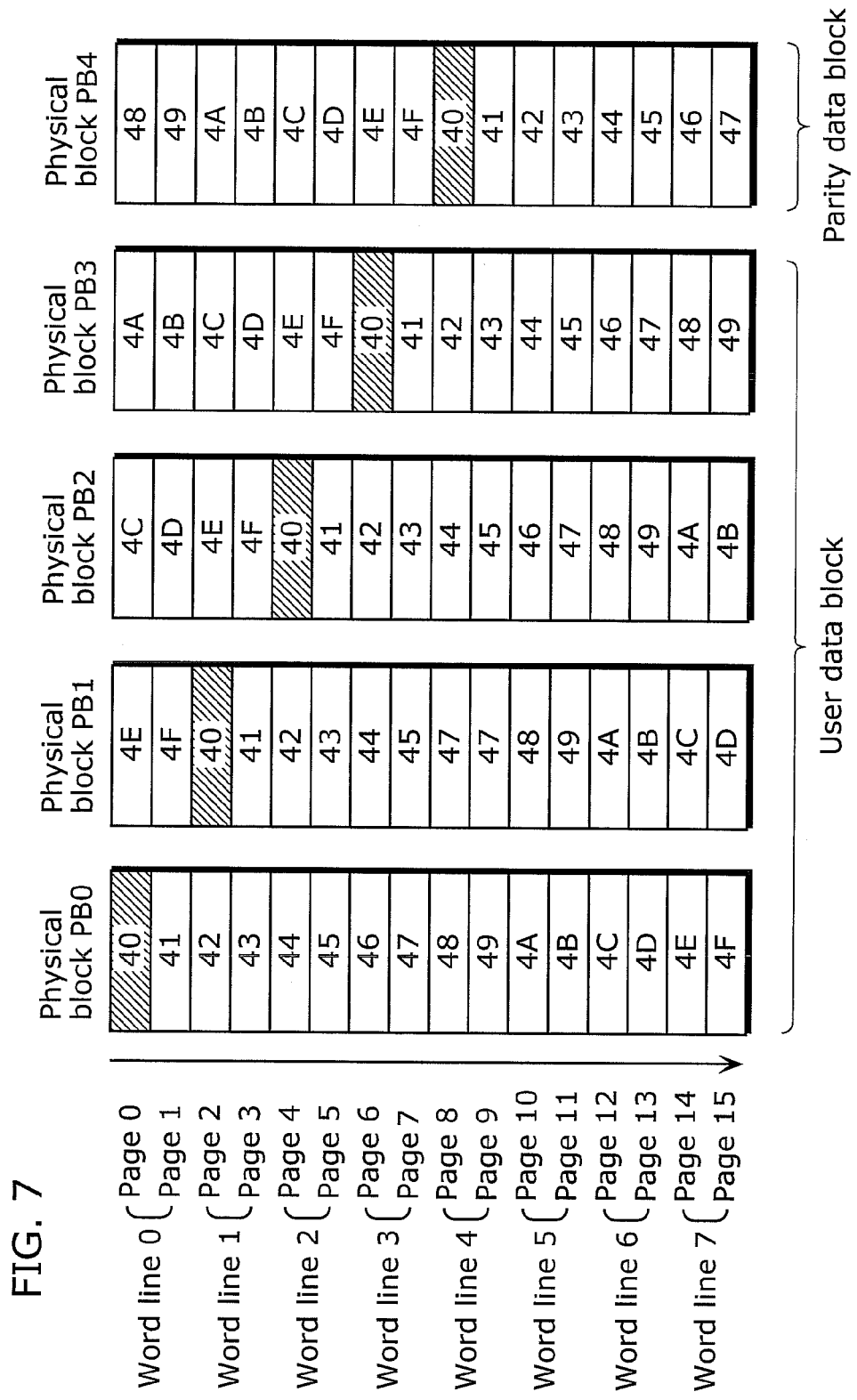
FIG. 7 is a diagram showing a relationship between each page in a physical block and a first ECC code in the semiconductor recording device according to a second variation of the first embodiment of the present invention.

Next, the semiconductor recording device according to a second variation of the first embodiment will be described with reference to FIG. 7. FIG. 7 is a diagram showing a relationship between each page in the physical blocks and the first ECC code (the user data and parity), in the semiconductor recording device according to the second variation of the first embodiment.

The NAND-type flash memory, in which the data of 2 bits or more is written into the same memory cell, includes a plurality of word lines for selecting and deselecting the plurality of memory cells included in the flash memory, and each of the word lines is connected to a corresponding one of the plurality of pages. In the NAND-type flash memory thus configured, a plurality of pages connected to the same word line may be regarded as having the same data retention characteristics, and the data having the first ECC code may be dispersely written into pages having different word line numbers in the physical blocks.

In other words, in the first embodiment and the variation thereof as described above, the symbols of the first ECC code are assigned on a per-page basis, but the present variation assigns the symbols of the first ECC code on a per-word line basis.

FIG. 7 shows a relationship between physical blocks arranged in parallel and the first ECC code in the case of recording the data in the five flash memories 6*a* to 6*e*. In FIG. 7, each of the physical blocks PB0, PB1, PB2, PB3, and PB4 is a physical block for a corresponding one of the five flash memories 6*a* to 6*e*. Then, each of the physical blocks includes 16 pages including 8 world lines 0 to 7 which sequentially indicate page 0 to page 15 from the top. Then, from the top, each two successive pages are connected to the same word line having the same word line number. Specifically, the word line 0 is connected to page 0 and page 1, the word line 1 is connected to page 2 and page 3, and likewise hereinafter, each of the word lines 2 to 7 are connected to each two pages.

The codes 40 to 4F attached to the respective physical blocks PB0 to PB4 are identification codes for identifying the first ECC code, and one first ECC code includes the data of five pages to which the same code number is added.

As shown in FIG. 7, since the same ECC-code symbol is assigned to pages connected to different word lines, it is possible to recover the data on a per-memory cell basis, using the first ECC code, from a read error derived from data retention characteristics.

As described above, in the semiconductor recording device according to the second variation of the first embodiment, the following processing is performed in the flash memory: (i) associating a plurality of physical blocks in at least one flash memory with each other to treat the associated physical blocks as a common group, (ii) generating the ECC code by generating parity data from the user data, (iii) assigning the symbol of the ECC code to pages having different page numbers, and (iv) writing the user data included in each ECC code into pages having a page number indicating a different word line number in the common group.

With this, even in the case of a configuration in which the data retention characteristics further deteriorate in a page which has a larger word line number and is located farther from the source line, it is possible to write the data included in the first ECC code in a form of dispersing a page having a larger word line number which indicates poorer data retention characteristics, thus allowing correcting a read error occurring in the page having a larger word line number, using the data in a page having a smaller word line number and having comparatively satisfactory data retention characteristics. This allows providing a semiconductor recording device having improved data retention characteristics.

In addition, in the present embodiment, the data is dispersed such that the symbol of the first ECC code having the same code is not assigned to pages having the same page number. This further equalizes the data retention characteristics of the semiconductor recording device, thus achieving further improvement in data retention characteristics.

(Second Embodiment)

Figure 8:
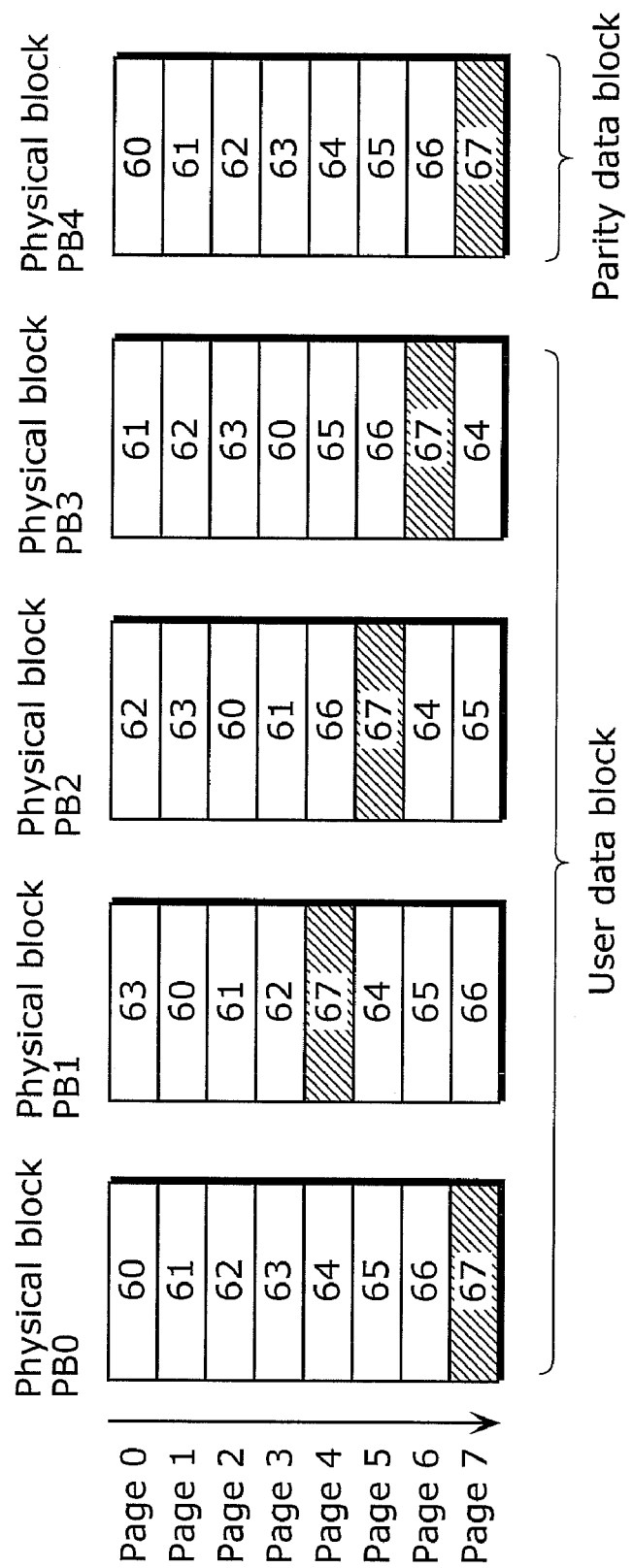
FIG. 8 is a diagram showing a relationship between each page so in a physical block and a first ECC code in the semiconductor recording device according to the second embodiment of the present invention.

Next, the semiconductor recording device according to the second embodiment will be described with reference to FIG. 8. FIG. 8 is a diagram showing a relationship between each page in the physical blocks and the first ECC code (the user data and parity), in the semiconductor recording device according to the second embodiment. Note that FIG. 8 shows the case of setting the range for dispersing the data included in the first ECC code (the range for assigning symbols of the first ECC code) to half of the physical blocks (among four pages).

Since the semiconductor recording device according to the first embodiment dispersely assigns the symbols of the first ECC code across the entire physical blocks (page 0 to page 7), there is a problem of increasing the amount of memory of the page shuffling unit 2. The semiconductor recording device according to the second embodiment responds to the above problem by limiting the range for assigning the symbols of the first ECC code.

Note that the configuration of the semiconductor recording device according to the present embodiment is the same as that of the first embodiment, and the description thereof will therefore be omitted.

First, as shown in FIG. 8, each of the physical blocks PB0 to PB4 includes, as with the first embodiment, eight pages which serially indicate page 0 to page 7 from the top.

The codes 60 to 67 added to pages in the respective physical blocks PB0 to PB4 are identification codes for identifying the first ECC code, and one first ECC code includes the data of five pages to which the same code number is added.

In addition, such a plurality of physical blocks are associated with each other as a common group corresponding to the first ECC code, and are divided into a plurality of sections according to page number. As shown in FIG. 8, in the present embodiment, the physical blocks PB0 to PB4 are halved into two sections: a first section in an upper half, which is a range including pages having page numbers from page 0 to page 3, and a second section in a lower half, which is a range including pages having page numbers from page 4 to page 7. Note that it is sufficient that the physical block is divided into at least two sections.

Moreover, in the semiconductor recording device according to the present embodiment, the page shuffling unit 2 assigns the symbols of the first ECC code to which the same code number is added, to pages in the same section such that the user data and the first ECC parity included in the first ECC code are written into the pages in the same section.

Specifically, as shown in FIG. 8, the data including the first ECC codes 60 to 63 (the user data and the first ECC parity) are dispersely assigned and written across the first section in the upper half, that is, to pages 0 to 3 in each physical block. In addition, the data including the first ECC codes 64 to 67 are dispersely assigned and written across the second section in the lower half, that is, to pages 4 to 7 in each physical block.

Figure 9:
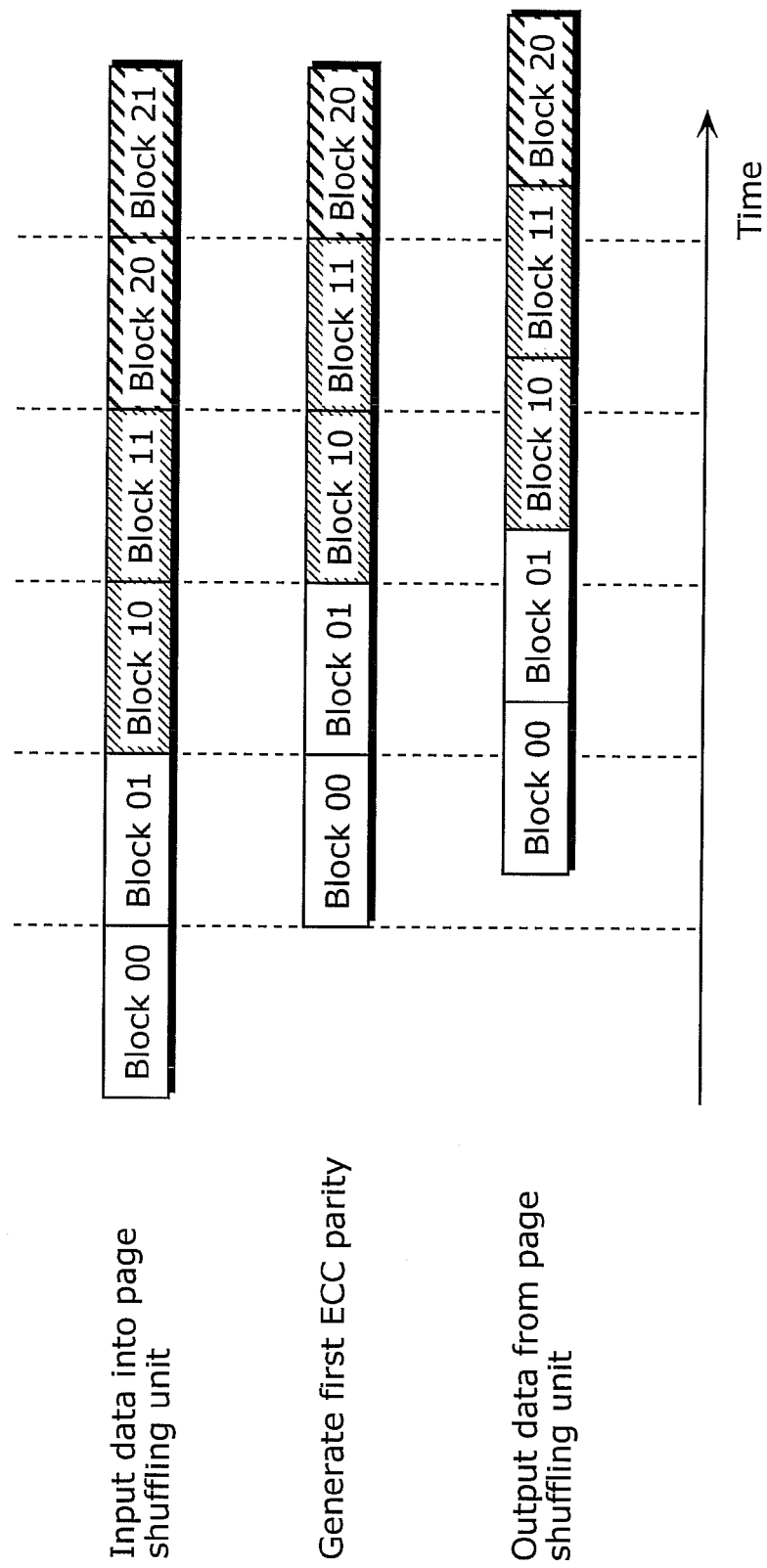
FIG. 9 is a timing chart indicating input and output performed by a page shuffling unit in a write operation of the semiconductor recording device according to the second embodiment of the present invention.

The operation of the page shuffling unit 2 at this time will be described with reference to FIG. 9. FIG. 9 is a timing chart indicating input and output performed by the page shuffling unit 2 in the write operation of the semiconductor recording device according to the second embodiment. Note that FIG. 9 is a timing chart in the case of setting the range for dispersing the data included in the first ECC code to half of each physical block (among four pages) as shown in FIG. 8. Accordingly, the block size in FIG. 9 is half the block size shown in FIG. 5. In other words, assuming that the data of 4 KB is recorded in each page in the physical block corresponding to the flash memory, the page shuffling unit 2 includes three memory areas of 80 KB (=4 KB*4*5) and the control circuit thereof. Each memory area includes the data storage unit of 64 KB (=4 KB*4*4) and the first ECC parity storage unit of 16 KB (=4 KB*4).

In FIG. 9, the top row indicates timing of data input into the page shuffling unit 2, and each block (block 00 to block 21 in the figure) represents the data storage unit of 64 KB (=4 KB*4*4). In addition, the respective blocks correspond to the pages included in the section resulting from the division, and each block in the present embodiment is equivalent to four pages. That is, block 00 is equivalent to four pages from page 0 to page 3 in the upper section, and the block 01 is equivalent to four pages from page 4 to page 7 in the lower section. Likewise, each of block 10 and block 20 is equivalent to four pages in the upper section, and each of block 11 and block 21 is equivalent to four pages in the lower section.

The data input into the page shuffling unit 2 is performed on a per-block basis of 64 KB. Specifically, the data input is alternately performed, on a per-section basis, between the upper section and the lower section, and after completion of the data input into all the pages in all the user data blocks in the upper section, the data input into the lower section is started.

According to the present embodiment, as shown in FIG. 9, after completion of the data input into the four pages in the upper half of the physical blocks PB0 to PB3, the data input into the four pages in the lower half of the same physical blocks PB0 to PB3 is started. After this, the data input into the four pages in the upper half of the physical blocks PB0 to PB3 is started, and subsequently the same processing is repeated. More specifically, in order of logical address, the first 64 KB is input in order of PB0-60, PB1-63, PB2-62, PB3-61, PB0-61, PB1-60, . . . , PB2-61, and PB3-60, and the next 64 KB is input in order of PB0-64, PB1-67, PB2-66, PB3-65, PB0-65, PB1-64, . . . , PB2-65, and PB3-64.

In addition, in FIG. 9, the middle row indicates the timing for generating the first ECC parity in the first ECC parity generation unit 3, and each block in the middle row (blocks 00 to 20 in the figure) represents a first ECC parity storage unit of 16 KB which corresponds to the data storage unit of 64 KB described above. As shown in FIG. 9, the first ECC parity is generated in the parity block on the basis of each section resulting from the division. According to the present embodiment, two sections, that is, the upper and lower sections are provided, so that the first ECC parity is generated for the pages in the lower section after generating the first ECC parity for the pages in the upper section.

According to the present embodiment, after generating the first ECC parity for the four pages in the upper section of the physical block PB4 shown in FIG. 8, the first ECC parity is generated for the four pages in the lower section of the same physical block PB4. More specifically, the first ECC parity for the first 64-KB data is generated, in the physical block PB4 in FIG. 8, in units of 4 KB in order of the code 60, 61, 62, and 63, and the first ECC parity for the next 64-KB data is generated in units of 4 KB in order of 64, 65, 66, and 67.

Note that as shown in the figure, after completion of input of the data of 64 KB that is equivalent to one block into the data storage unit, the first KC parity for the data is generated.

In addition, in FIG. 9, the bottom row indicates the timing of data output from the page shuffling unit 2, and each block in the bottom row (blocks 00 to 20 in the figure) is 80 KB which includes both the user data and the first ECC parity. The data is output to the data storage unit in order of input as shown in the figure, and the first ECC parity is output in order of generation. As shown in the figure, each time the first ECC parity is generated, the data including both the user data and the first ECC parity is output.

Thus, the page shuffling unit 2, as well as the first ECC parity generation unit 3, is controlled by pipeline on a per-block basis.

Note that the subsequent operation is performed in the same manner as in the first embodiment.

As described above, with the semiconductor recording device according to the second embodiment, since the range for assigning the first ECC code symbols is divided into a plurality of sections, it is possible to reduce the amount of memory to be installed.

Furthermore, by dividing the range for assigning the first ECC code symbols into a plurality of sections, it is possible to reduce the unit of writing. This allows increasing processing speed.

(First Variation of the Second Embodiment)

Figure 10:
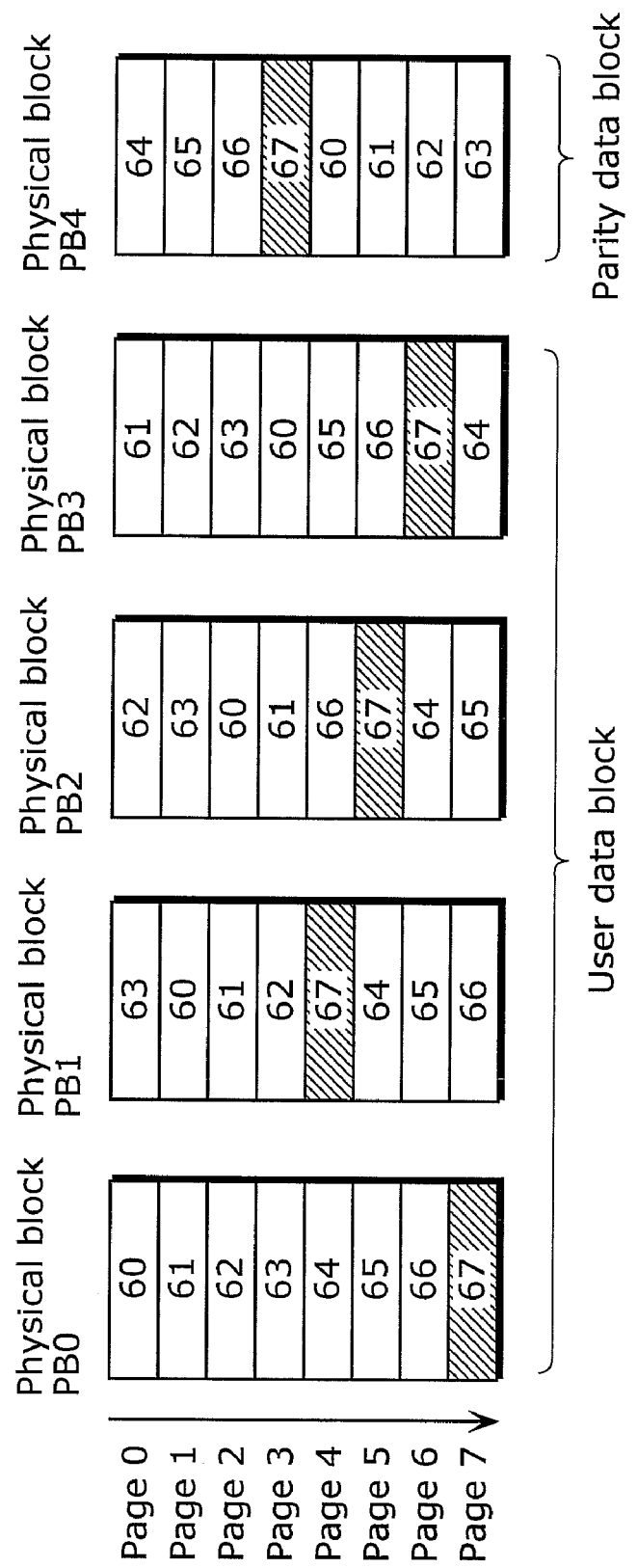
FIG. 10 is a diagram showing a relationship between each page in a physical block and a first ECC code in the semiconductor recording device according to a first variation of the second embodiment of the present invention.

Next, the semiconductor recording device according to a first variation of the second embodiment will be described with reference to FIG. 10. FIG. 10 is a diagram showing a relationship between each page in the physical blocks and the first ECC code (the user data and the parity), in the semiconductor recording device according to the first variation of the second embodiment.

In the semiconductor recording device according to the second embodiment described above, when focusing, in FIG. 8, on the page numbers of pages which are included in each physical block and into which the data included in the first ECC code 67 is written, such pages include two pages indicating page number 7 which is the last page in the physical block and has the most significant deterioration in data retention characteristics. Likewise, when focusing on the first ECC code 66, the pages into which the data is written includes one page 7, but two pages have page number 6 having the most significant deterioration in data retention characteristics next to page 7. Thus, the technique (assignment method) for dispersing the symbols of the first ECC code as shown in FIG. 8 produces a small effect in improving the data retention characteristics.

Thus, in the present variation, another technique for dispersing the symbols of the first ECC code will be described, which is a technique that allows further improvement of the data retention characteristics than the semiconductor recording device according to the second embodiment shown in FIG. 8.

As shown in FIG. 10, each of the physical blocks PB0 to PB4 includes eight pages which serially indicate page 0 to page 7 from the top.

The codes 60 to 67 attached to pages in the respective physical blocks PB0 to PB4 are identification codes for identifying the first ECC code, and one first ECC code includes the data of 5 pages to the same code number is added.

In addition, such physical blocks are associated as a common group corresponding to the first ECC code, and are divided into a plurality of sections according to page number. FIG. 10, as in FIG. 8, the physical blocks PB0 to PB4 are halved into two sections: a first section in an upper half, which is a range including pages having page numbers from page 0 to page 3, and a second section in a lower half, which is a range including pages having page numbers from page 4 to page 7.

Moreover, in the semiconductor recording device according to the present variation, the page shuffling unit 2 assigns the symbol of the first ECC code to which the same code number is added such that the user data and the first ECC parity that are included in the first ECC code are written into the pages in different sections. In addition, in the first ECC codes to which a code indicating the same number is added, the user data items included in the first ECC code are assigned to the pages in the same section. In addition, the first ECC parity items included in the first ECC code are also assigned to the pages in the same section.

Specifically, of the data including the first ECC codes 60 to 63, the user data is written such that the symbols of the first ECC codes 60 to 63 are dispersed across the first section in the upper half, that is, to pages 0 to 3 in each physical block. In addition, of the data including the first ECC codes 64 to 67, the user data is written such that the symbols of the first ECC codes 64 to 67 are dispersed across the second section in the lower half, that is, to pages 4 to 7 in each physical block.

On the other hand, of the data including the first ECC codes 60 to 63, the first ECC parity is written such that the symbols of the first ECC codes are dispersed across the second section in the lower half, that is, pages 4 to 7 in each physical block. In addition, of the data including the first ECC codes 64 to 67, the first ECC parity is written such that the symbols of the first ECC codes 64 to 67 are dispersed across the first section in the upper half, that is, to pages 4 to 7 in each physical block.

Figure 11:
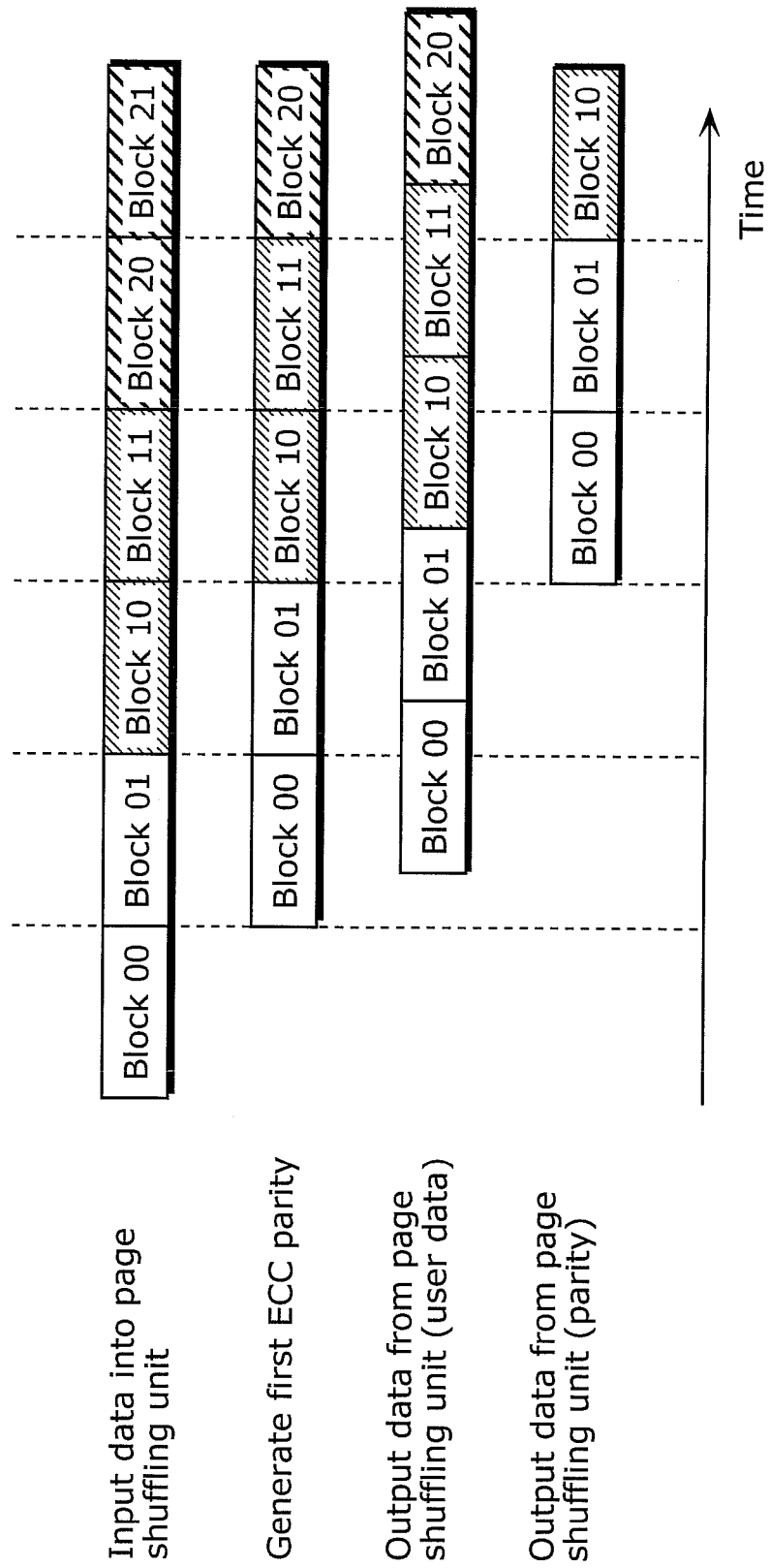
FIG. 11 is a timing chart indicating input and output performed by a page shuffling unit in a write operation of the semiconductor recording device according to the first variation of the second embodiment of the present invention.

The operation of the page shuffling unit 2 at this time will be described with reference to FIG. 11. FIG. 11 is a timing chart indicating input and output performed by the page shuffling unit 2 in the write operation of the semiconductor recording device according to the first variation of the second embodiment. Note that FIG. 11 is a timing chart in the case of setting the range for dispersing the data included in the first ECC code to half of each physical block (among four pages) as shown in FIG. 10.

Accordingly, the block size in FIG. 11 is half the block size shown in FIG. 5, and assuming that the data of 4 KB is recorded in each page in the physical block corresponding to the flash memory, the page shuffling unit 2 includes three areas of the data storage unit of 64 KB (=4 KB*4*4) and four areas of the ECC parity storage unit of 16 KB (=4 KB*4).

In FIG. 11, the top row indicates timing of data input into the page shuffling unit 2, and each block (block 00 to block 21 in the figure) represents the data storage unit of 64 KB (=4 KB*4*4). In addition, the respective blocks, as with the second embodiment, correspond to the pages included in the sections resulting from the division, and in the present variation, each block in the top row in the figure is equivalent to four pages. That is, each of blocks 00, 10, and 20 correspond to four pages from page 0 to page 3 in the upper section, and each of blocks 01, 11, and 21 corresponds to four pages from page 4 to page 7 included in the lower section. The data input into the page shuffling unit 2 is performed on a per-block basis of 64 KB, and as with the second embodiment, the data input is alternately performed, on a per-section basis, between the upper section and the lower section, and after completion of the data input into all the pages in all the user data blocks in the upper section, the data input into the lower section is started.

More specifically, in order of logical address, the first 64 KB is input, as with the second embodiment, in order of PB0-60, PB1-63, PB2-62, PB3-61, PB0-61, PB1-60, . . . , PB2-61, and PB3-60, and the next 64 KB is input in order of PB0-64, PB1-67, PB2-66, PB3-65, PB0-65, PB1-64, . . . , PB2-65, and PB3-64.

In addition, in FIG. 11, the second row indicates the timing for generating the first ECC parity in the first ECC parity generation unit 3, and each block in the second row (blocks 00 to 20 in the figure) represents a first ECC parity storage unit of 16 KB which corresponds to the data storage unit of 64 KB described above. As shown in FIG. 11, the first ECC parity is generated in the parity block on the basis of each section resulting from the division. According to the present embodiment, two sections, that is, the upper and lower sections are provided, so that, after generating the first ECC parity for the pages in the lower section first, the first ECC parity is subsequently generated for the pages in the upper section.

According to the present embodiment, after generating the first ECC parity for the four pages in the upper section of the physical block PB4 shown in FIG. 8, the first ECC parity is generated for the four pages in the lower section of the same physical block PB4 shown in FIG. 11. More specifically, the first ECC parity for the first 64-KB data is generated, in the physical block PB4 in FIG. 10, in units of 4 KB in order of the code 60, 61, 62, and 63 in the lower section, and the first ECC parity for the next 64-KB data is generated in units of 4 KB in order of the code 64, 65, 66, and 67 in the upper section.

Note that as shown in the figure, after completion of input of the data of 64 KB that is equivalent to one block into the data storage unit, the first ECC parity for the data is generated.

In addition, in FIG. 11, the third row indicates timing of data output from the user data storage unit, and each block in the third row (block 00 to 20 in the figure) represents 64 KB of the user data storage unit, and the output from the user data storage unit is performed in order of input shown in the figure.

In addition, in FIG. 11, the bottom row indicates timing of data output from the first ECC parity storage unit, and the data output is performed in order of 64, 65, 66, 67, 60, 61, 62, and 63, which is different from the order of generating the first ECC parity.

Thus, it is possible to add an offset to page alignment of each physical block in the first ECC parity storage unit. This allows restricting the number of bytes of the data which is included in the first ECC code and written into the page near the last page in the physical block, which has most significant deterioration in data retention characteristics.

Accordingly, it is possible to further reduce the amount of memory to be installed and also to produce a satisfactory effect in improving data retention characteristics using the first ECC code.

Note that in FIG. 10, the case of assigning, to the same page number, the data of 1 byte or less from among the bytes of the first ECC code has been described, but it goes without saying that the data of a plurality of bytes may be assigned to the same page number when the first ECC code has a large number of bytes and a plurality of parity pieces are added thereto.

In addition, it goes without saying that the same effect can be produced using, instead of the technique described in the present embodiment, the control on a per-word line basis as shown in FIG. 6 in the first embodiment.

As described above, in the semiconductor recording device according to the first variation of the second embodiment, the following processing is performed in the flash memory: (i) associating a plurality of physical blocks in at least one flash memory with each other to treat the associated physical blocks as a common group, (ii) dividing the physical blocks in the common group into two or more sections according to page number, (iii) generating an ECC code by generating parity data from the user data, (iv) assigning a symbol of the ECC code to pages having different page numbers in the same section, and (v) writing part of the data included in the ECC code into pages having the page number in different sections in the common group.

With this, for example, by writing only the ECC parity across is different sections in the physical blocks, it is possible to save the amount of memory to be installed and also to write the data by dispersing the page which has a larger page number and has a higher possibility of deterioration in data retention characteristics. Accordingly, it is possible to provide a semiconductor recording device which produces a satisfactory effect in improving data retention characteristics using the first ECC code.

Thus far, the semiconductor recording device and the semiconductor recording device control method according to some embodiments and the variations thereof have been described, but the present invention is not limited to such embodiments and variations.

For example, the semiconductor recording device control method according to the embodiments and the variations described above may be configured using a computer program that is executed using a computer. In addition, the computer program used for the semiconductor recording device control method may be recorded on a computer-readable recording medium. Examples of the recording medium include: a magnetic disk, an optical disc, a magneto optical disk, an IC card, a semiconductor memory a flexible disk, a hard disk, a CD-ROM, a DVD, a DVD-ROM, a DVD-RAM, and a Blu-ray disc (BD).

Other than the above, those skilled in the art will readily appreciate that many modifications are possible in the exemplary embodiments without departing from the novel teachings and advantages of this invention. Accordingly, all such modifications are intended to be included within the scope of this invention.

INDUSTRIAL APPLICABILITY

A semiconductor recording device according to an implementation of the present invention is applicable to a semiconductor recording device and so on such as a memory card. Particularly, the semiconductor recording device according to an implementation of the present invention is intended to deal with variation in data retention characteristics of pages included in a physical block in a nonvolatile memory provided inside, and thus it is possible to suppress variation in data retention characteristics between pages by generating and writing the ECC code across the pages in the nonvolatile memory. Thus, the semiconductor recording device according to an implementation of the present invention is widely usable as a semiconductor recording device in the field of professional-use image recording.

What is claimed is:

1. A semiconductor recording device comprising:
at least one nonvolatile memory including a plurality of physical blocks each including a plurality of pages;
an interface unit configured to receive data that is to be recorded on said at least one nonvolatile memory;
an ECC generation unit configured to generate an error correcting (ECC) code by adding parity data to the data;
a recording unit configured to record data that is based on the ECC code, in said plurality of pages included in said at least one nonvolatile memory; and
a control unit configured to control assignment of a symbol of the ECC code to said plurality of pages, wherein said plurality of physical blocks are associated with each other as a common group, and said control unit is configured to control assignment of the symbol of the ECC code such that the symbol of the ECC code is assigned to pages having at least two page numbers across said plurality of physical blocks in the common group.

2. The semiconductor recording device according to claim 1, wherein said control unit is configured to control the assignment of the symbol of the ECC code such that the number of symbols of the ECC code is smallest, the symbols being assigned to pages having a same page number across said physical blocks in the common group.

3. The semiconductor recording device according to claim 2, wherein said control unit is configured to control the assignment of the symbol of the ECC code such that a same symbol of the ECC code is not assigned to pages having the same page number.

4. The semiconductor recording device according to claim 1, wherein said control unit is configured to control the assignment of the symbol of the ECC code such that the number of symbols of the ECC code is equal to or smaller than the number of parity data items included in the ECC code, the symbols being assigned to pages having the same page number across said physical blocks in the common group.

5. The semiconductor recording device according to claim 1, wherein said control unit is configured to control the assignment of the symbol of the ECC code such that the number of symbols of the ECC code is equal to or smaller than the number of parity data items included in the ECC code, the symbols being assigned to pages having a last page number across said physical blocks in the common group.

6. The semiconductor recording device according to claim 1, wherein said control unit is configured to divide the common group into at least two sections according to page number, and to control the assignment of the symbol of the ECC code such that the symbol of the ECC code is assigned to a page in one of the at least two sections.

7. The semiconductor recording device according to claim 1, wherein said control unit is configured to divide the common group into at least two sections according to page number, and to control the assignment of the symbol of the ECC code such that each of user data and the parity data that are included in the ECC code is recorded in a page in a different section.

8. The semiconductor recording device according to claim 1, further comprising a plurality of word lines through which a plurality of memory cells included in said at least one nonvolatile memory are selected or deselected, wherein each of said plurality of word lines is connected to a corresponding one of said plurality of pages, said control unit is configured to control the assignment of the symbol of the ECC code such that the number of symbols of the ECC code is smallest, the symbols being assigned to the pages having a same word line number in the common group.

9. The semiconductor recording device according to claim 8, wherein said control unit is configured to control the assignment of the symbol of the ECC code such that the same symbol of the ECC code is not assigned to the same word line number.

10. The semiconductor recording device according to claim 9, wherein said control unit is configured to control the assignment of the symbol of the ECC code such that the same symbol of the ECC code is not assigned to pages having the same page number.

11. The semiconductor recording device according to claim 1, further comprising a plurality of word lines through which a plurality of memory cells included in said at least one nonvolatile memory are selected or deselected, wherein each of said plurality of word lines is connected to a corresponding one of said plurality of pages, and said control unit is configured to control the assignment of the symbol of the ECC code such that the number of symbols of the ECC code is equal to or smaller than the number of parity data items included in the ECC code, the symbols being assigned to pages having the same word line number in the common group.

12. The semiconductor recording device according to claim 1, further comprising a plurality of word lines through which a plurality of memory cells included in said at least one nonvolatile memory are selected or deselected, wherein each of said plurality of word lines is connected to a corresponding one of said plurality of pages, said control unit is configured to control the assignment of the symbol of the ECC code such that the number of symbols of the ECC code is equal to or smaller than the number of parity data items included in the ECC code, the symbols being assigned to pages having a last word line number in the common group.

13. The semiconductor recording device according to claim 1, further comprising a plurality of word lines through which a plurality of memory cells included in said at least one nonvolatile memory are selected or deselected, wherein each of said plurality of word lines is connected to a corresponding one of said plurality of pages, said control unit is configured to divide the common group into at least two sections, and to control the assignment of the symbol of the ECC code such that the symbol of the ECC code is assigned to a page in one of the at least two sections.

14. The semiconductor recording device according to claim 1, further comprising a plurality of word lines through which a plurality of memory cells included in said at least one nonvolatile memory are selected or deselected, wherein each of said plurality of word lines is connected to a corresponding one of said plurality of pages, said control unit is configured to divide the common group into at least two sections according to a word line number, and to control the assignment of the symbol of the ECC code such that each of user data and the parity data that are included in the ECC code is recorded in a page in a different section.

15. The semiconductor recording device according to claim 1, comprising
- a second ECC generation unit configured to generate a second ECC code by adding second ECC parity data to the user data and the parity data that are included in the ECC code;
- a read unit configured to read the second ECC code recorded on said at least one nonvolatile memory;
- a second ECC correction unit configured to correct an error based on the second ECC code read by said read unit; and
- a first ECC correction unit configured to correct an error based on the ECC code, according to a position at which said second ECC correction unit is unable to complete the error correction.

16. A method of controlling a semiconductor recording device that includes at least one nonvolatile memory including a plurality of physical blocks each of which includes a plurality of pages and which are associated with each other as a common group, said method comprising:
- receiving data that is to be recorded on the at least one nonvolatile memory;
- generating an error correcting (ECC) code by adding parity data to the data;
- recording data that is based on the ECC code, in the plurality of pages included in the at least one nonvolatile memory;
- controlling assignment of a symbol of the ECC code to the plurality of pages; and
- controlling assignment of the symbol of the ECC code such that the symbol of the ECC code is assigned to pages having at least two page numbers across said plurality of physical blocks in the common group.

17. A non-transitory computer-readable recording medium on which a program for controlling a semiconductor recording device that so includes at least one nonvolatile memory including a plurality of physical blocks each of which includes a plurality of pages and which are associated with each other as a common group, the program causing a computer to execute:
- receiving data that is to be recorded on the at least one nonvolatile memory;
- generating an error correcting (ECC) code by adding parity data to the data;
- recording data that is based on the ECC code, in the plurality of pages included in the at least one nonvolatile memory; and
- controlling assignment of the symbol of the ECC code such that the symbol of the ECC code is assigned to pages having at least two page numbers across said plurality of physical blocks in the common group.

* * * * *